(12) United States Patent
Macphail

(10) Patent No.: US 7,616,934 B2
(45) Date of Patent: Nov. 10, 2009

(54) SWITCHED IMPEDANCE TRANSFORMER FOR SEMICONDUCTOR CIRCUITS

(75) Inventor: Philip Macphail, Cherry Hinton (GB)

(73) Assignee: SiGe Semiconductor (Europe) Limited, Hertfordshire (GB)

( * ) Notice: Subject to any disclaimer, the term of this patent is extended or adjusted under 35 U.S.C. 154(b) by 444 days.

(21) Appl. No.: 11/636,642

(22) Filed: Dec. 11, 2006

(65) Prior Publication Data

US 2008/0139131 A1 Jun. 12, 2008

(51) Int. Cl.
H04B 1/06 (2006.01)
(52) U.S. Cl. .............. 455/248.1; 455/333; 455/338
(58) Field of Classification Search ............ 455/230, 455/232.1, 234.1, 248.1, 313, 323, 333, 334, 455/338, 341
See application file for complete search history.

(56) References Cited

U.S. PATENT DOCUMENTS 6,879,205 B2 * 4/2005 Courau ................. 327/391
7,206,551 B2 * 4/2007 Itakura et al. ............ 455/73
7,305,221 B2 * 12/2007 Yamamoto .............. 455/283
7,342,300 B2 * 3/2008 Wight et al. ............. 257/678
7,391,283 B2 * 6/2008 Kearns .................. 333/103
7,528,471 B2 * 5/2009 Wight et al. ............. 257/678
2004/0253939 A1 * 12/2004 Castaneda et al. ......... 455/341
2006/0270367 A1 * 11/2006 Burgener et al. ........ 455/127.1

* cited by examiner

*Primary Examiner*—Nhan T Le
(74) *Attorney, Agent, or Firm*—Townsend and Townsend and Crew, LLP

(57) ABSTRACT

A method of providing an impedance match for an integrated semiconductor circuit to other microwave elements is provided by allowing the selection of one of a plurality of impedance matching ratios between the circuit and other elements. The tunable impedance match comprises a microwave impedance transformer with at least a single primary winding, and a plurality of secondary windings, wherein the winding configuration is determined by an electrical switching apparatus allowing the secondary windings to be connected in series, parallel and combinations thereof to provide the required impedance matching. The method allows for both dynamic matching of an integrated semiconductor circuit for increased efficiency, and hence reduced power consumption, and directly matching said circuit to high impedance antennae etc.

35 Claims, 8 Drawing Sheets

SWITCHED IMPEDANCE TRANSFORMER FOR SEMICONDUCTOR CIRCUITS

FIELD OF THE INVENTION

The invention relates to the field of impedance matching semiconductor circuits to external antenna, and more specifically the dynamic matching for reduced power consumption in mobile devices.

BACKGROUND OF THE INVENTION

In the past sixty years, the use of wireless and RF technology has increased dramatically, and in ways few could have foreseen, from limited military radar applications to today's ubiquitous penetration of wireless and microwave technology. The applications have expanded immensely but equally also have the volumes and customer base as applications such as RFID and cellular telephony have taken hold, but also in terms of functionality and complexity, and expectations of the consumers and users of these systems.

Today the plain old telephone for most people is now a portable, highly compact and light communications centre which provides not only telephony but also Internet access for email, web browsing and up-loading or downloading files together with music player, camera, and personal data assistant (PDA). But customers expect these with reduced cost, increased battery lifetime, and able to operate worldwide without intervention. As such, the cellular telephone is already required to operate on a number of different frequency bands to provide such worldwide usage of the cellular telephone. Moreover, with the drive for new cellular telephone features such as Global Positioning System (GPS) providing enhanced navigation and location fixing the ability to receive or transmit signal in other frequency bands will be required.

Naturally, the expanding capability of the cellular telephone must be achieved with an eye on cost, both from the user perspective but also the system operator or carrier. For the user, cost is normally a consideration of how much to pay for buying the phone and how many minutes per month at what fee. Power consumption of the cellular telephone is generally only factored by the consumer indirectly by how much talk-time or surf-time along is permitted between charging cycles. For the system operator, power is an important aspect of cost. The microwave infrastructure costs of the network include the cost of electrical consumption. Therefore, as more power is required, the more costly and the more difficult it is to provision not only in the context of a remote site, but also in today's urban environments where cellular density is increasing with microcells and picocells. In addition, power dissipation in the cellular telephone has important implications in the design of the cellular telephone and associated thermal management within the body or casing of the telephone.

An important aspect of this power dissipation is the efficiency of matching the microwave transmitter and receiver electronics to the cabling or antenna of the infrastructure and handheld wireless device. As a result, most electronic systems are designed to match one of a limited number of impedances such as 50 Ohms, generally used in microwave and RF applications, or 75 Ohm, as used within CATV, thereby removing for most the consideration of mismatches and wasted power. However, a free-space antenna's output impedance is typically 377 Ohm and is subject to variation based upon atmospheric effects, the proximity of the antenna to metal, and even the presence or absence of a user's head for cellular systems. A poor match often results in the transmission device purposefully increasing the output power of the amplifier to compensate for the lost power, thereby increasing overall power consumption.

Additionally, and generally not considered, is the variation in efficiency of the amplifier as its output power is adjusted even in a well-matched network. High efficiency in a power amplifier is achieved when the voltage swing across the output stage is at a maximum, often reaching the actual limits of the voltage supply. When this occurs very little power is dissipated by the output transistor devices, as when the transistor is conducting maximum current there is minimum voltage across it, and vice versa.

Now, when the transmitter output power is reduced, the output voltage swing across the output transistors is reduced. This results in a significant voltage across the output transistor devices when a significant current flows, and hence significant power dissipation.

In both examples, either the varying impedance mismatch or the varying output power, it is well appreciated by the community of designers involved in power amplifiers that there is an advantage in dynamically adjusting the impedance of a matching circuit within a microwave circuit. For the case of an impedance mismatch, such an impedance adjustment reduces the mismatch and hence wasted power. It should be appreciated that such an adjustment might be an increase or decrease in impedance. For the case of reducing the output power of an amplifier increasing the load impedance presented to the amplifier results in an increase of the output voltage swing, resulting in a smaller signal across the output transistor devices and therefore reduced power dissipation and increased efficiency.

It would therefore be advantageous in scenarios where power consumption is an important aspect of a network or handheld wireless device to remove the fixed nature of today's microwave circuits and systems and add a tunable impedance element. It would be a further advantage if the approach offered circuit designers a flexible design methodology to allow implementation within a wide range of circuits, was implementable in an extremely compact and low cost manner, and was compatible with integration to today's semiconductor microwave circuit technologies such as SiGe, GaAs, and InP as well as silicon.

SUMMARY OF THE INVENTION

In accordance with the invention there is provided a circuit comprising a carrier which supports an input port, for receiving an input RF signal, and an output port. The output port supports a set of predetermined available impedance characteristics for providing an output RF signal based on the input RF signal. The circuit comprising a first conductor disposed upon the carrier for transmission of the input RF signal, a second conductor disposed upon the carrier for being inductively coupled to the first conductor, and a third conductor disposed upon the carrier for being inductively coupled to the first conductor. Additionally disposed is at least a switch operable between a first state and a second state, the at least a switch for in the first state resulting in the second conductor and third conductor electrically coupled in series.

The at least a switch in the first state providing for coupling of the first conductor, the second, and third conductor between the input port and the output port for providing a first impedance characteristic from the predetermined set of available impedance characteristics at the output port; and in the second state resulting in the second and third conductors electrically coupled in parallel, and wherein, in the second state, the first conductor and the second and third conductors are electrically coupled between the input port and the output port for providing a second other impedance characteristic from the predetermined set of available impedance characteristics at the output port.

In accordance with one other possible embodiment of the invention there is provided a circuit integrated to a substrate, the circuit comprising at least an input port integrated within the substrate for receiving an input RF signal and an output port integrated within the substrate. The output port supporting each of a predetermined set of available impedance characteristics for providing an output RF signal based on the input RF signal.

Also integrated within the substrate are a first electrical track for transmission of the input RF signal, a second electrical track integrated within the substrate for being inductively coupled to the first electrical track, and a third electrical track integrated within the substrate for being inductively coupled to the first electrical track. Further the circuit providing at least a switch integrated within the substrate.

The at least a switch operable between a first state and a second state, the at least a switch for in the first state resulting in the second electrical track and third electrical track electrically coupled in a first configuration and wherein, in the first state, the first electrical track and the second and third electrical tracks are electrically coupled between the input port and the output port for providing a first impedance characteristic from the predetermined set of available impedance characteristics at the output port; and for in the second state resulting in a the second and third electrical track electrically coupled in a second configuration, and wherein, in the second state, the first electrical track and the second and third electrical tracks are electrically coupled between the input port and the output port for providing a second other impedance characteristic from the predetermined set of available impedance characteristics at the output port.

BRIEF DESCRIPTION OF THE DRAWINGS

Exemplary embodiments of the invention will now be described in conjunction with the following drawings, in which.

DETAILED DESCRIPTION OF EMBODIMENTS OF THE INVENTION

Figure 1:
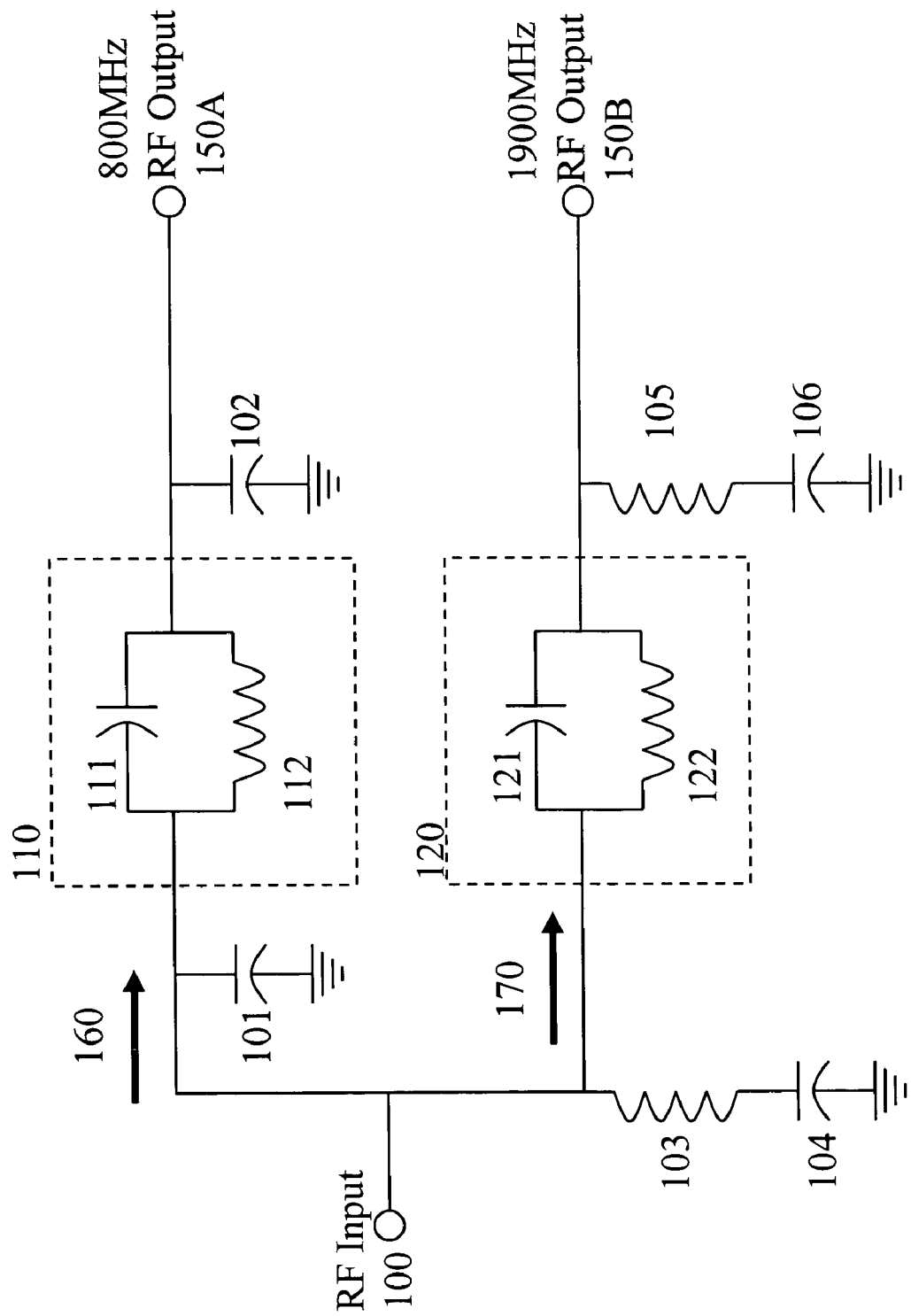
FIG. 1 illustrates a typical prior art fixed impedance matching circuit used within microwave circuits.

FIG. 1 illustrates a prior art fixed impedance matching circuit used within microwave circuits. Shown is an RF input port 100, which receives a microwave signal from a preceding microwave circuit (not shown) for matching to one of the RF output ports 150A and 150B according to the frequency of the microwave signal.

Shown is a first path 160 comprising a first parallel resonant circuit 110 comprised of inductor 112 and capacitor 111, together with capacitors 101 and 102. This first parallel resonant circuit presents a resonant open circuit to signals not intended for the RF output port 150A. For signals within the appropriate frequency band, the inductor 112 in combination with the capacitors 101 and 102 provides an impedance match to the 50 Ohm output impedance of the RF output port 150A.

Also shown is the second path 170, which includes a shunt circuit, comprising inductor 103 and capacitor 104. The second parallel resonant circuit 120 is formed by an inductor 122 and capacitor 121, which presents a parallel resonant open circuit to signals in the 800 MHz range, cellular AMPS transmit band, ensuring no signals within this frequency band are transmitted to the RF output port 150B. The inductor 105 and capacitor 106 in the path 170 provide in combination a 50 Ohm impedance match to the RF output port 150B. In this manner RF signals within two different transmit frequency bands are impedance matched to their respective 50 Ohm RF output ports. The circuit is fixed based upon the impedance of the input port 100, the impedance of the RF output ports 150A and 150B and the frequency bands for the two ports, in the embodiment shown the 800 MHz AMPS cellular transmit band and the 1900 PCS cellular transmit band. Clearly, the ability to vary or select the inductor value would allow the selection of the resonant frequency.

Figure 2:
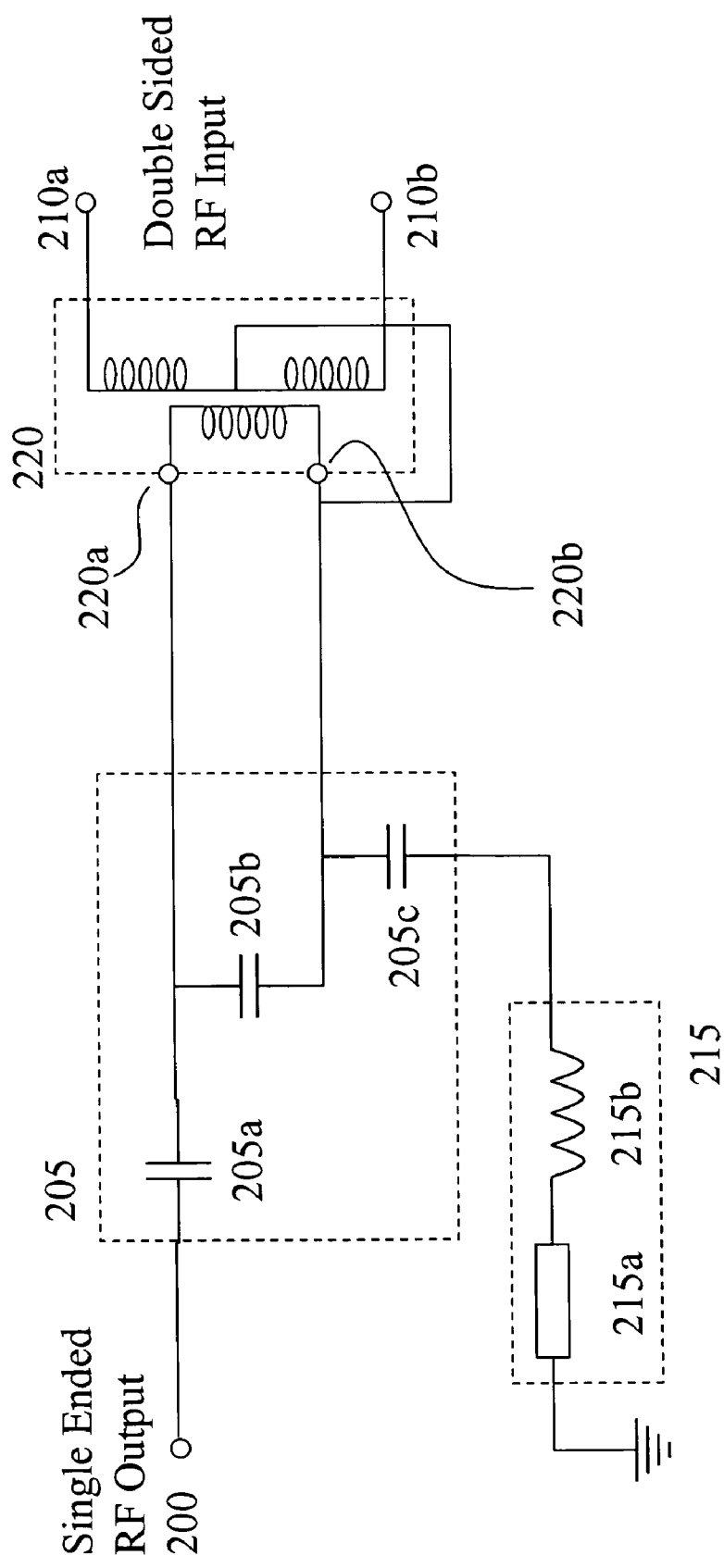
FIG. 2 illustrates a typical prior art fixed impedance matching circuit and converter between double-sided RF system, such as a push-pull amplifier, and a single sided output such as coaxial cable or an antenna.

FIG. 2 illustrates a prior art fixed impedance matching circuit and converter. In this prior art example, a double-sided RF system, such as a push-pull amplifier, is firstly converted to a single sided output configuration, such as required by coaxial cable, transmission line or an antenna, before being impedance matched to the output port 200.

As shown a double-sided RF signal is coupled to the RF input ports 210a and 210b, which are electrically coupled to the Balun 220. A Balun 220 being a balanced-to-unbalanced transformer is for converting double-sided signals to single sided signals. The output ports of the Balun 220, ports 220a and 220b, are coupled to line impedance matching circuit 205, which comprises, in this embodiment, capacitors 205a, 205b, and 205c. Capacitor 205c providing a ground circuit path, capacitor 205a providing for DC blocking of any output signal, and capacitor 205b operating in conjunction with the inductance of the Balun 220 to provide an impedance match to the single sided RF output port 200.

The ground circuit path capacitor 205a is chosen such that at the desired operating frequencies the impedance of this path is approximately minimized in conjunction with the bond-wire and package inductance and resistance of the circuit to a ground connection. These are shown by the package circuit 215 and comprising resistance 215a and inductance 215b.

As a result, a double-sided to single-sided RF output path is impedance matched with fixed discrete components to provide appropriate match at the desired frequency range of operation.

Figure 3:
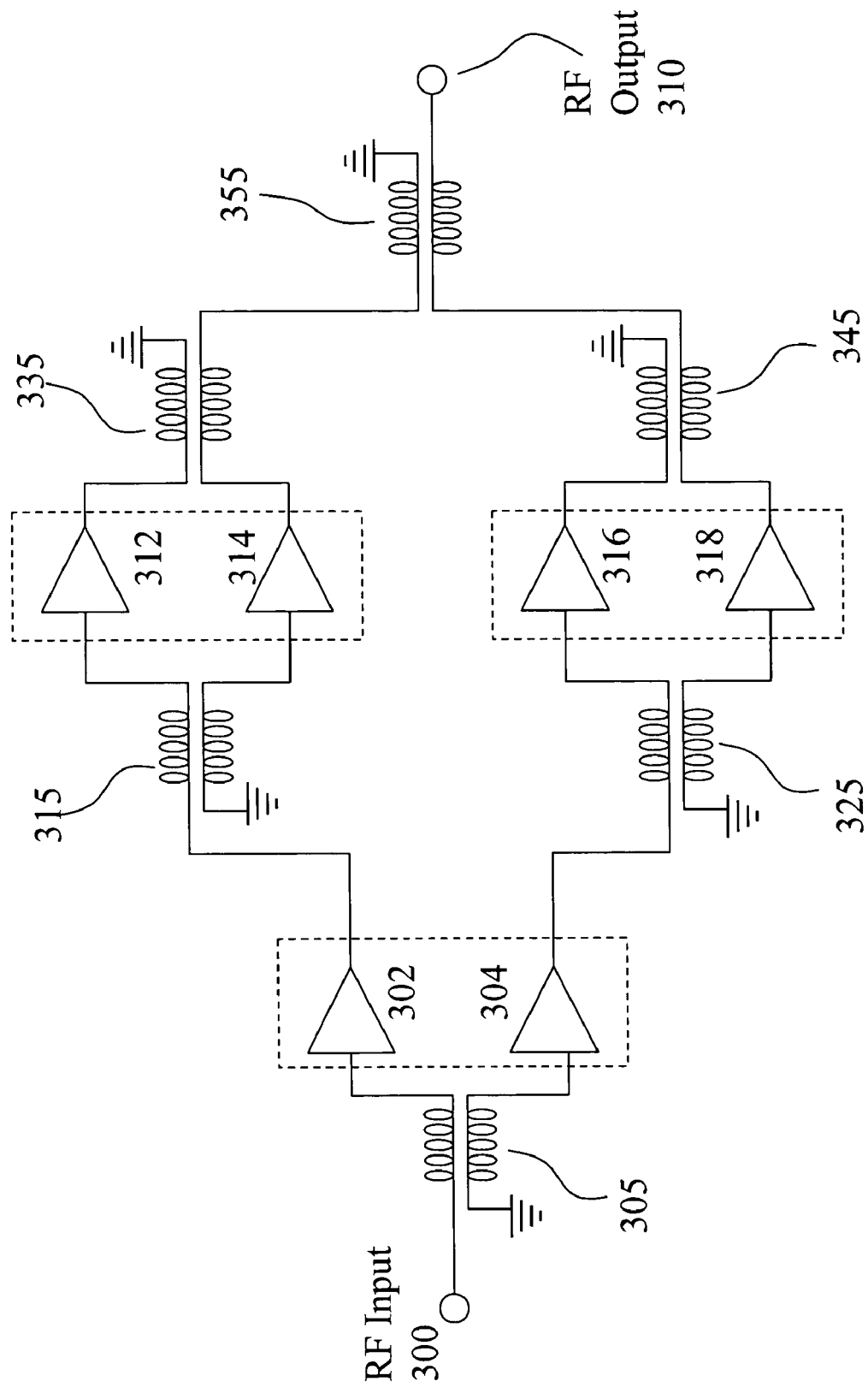
FIG. 3 illustrates a prior art used of fixed impedance transformations to combine the outputs of multiple RF amplifiers to a single output.

FIG. 3 illustrates a prior art use of fixed impedance transformations to combine output signals of multiple RF amplifiers to a single output signal. No additional distributed discrete impedance matching is performed as the amplifier circuits 302, 304, 312, 314, 316 and 318 contain such discrete circuit matching elements (not shown for clarity). Shown is an RF input port 300, which receives a microwave signal for amplification. The application is for CATV where a high power RF signal is intended for distribution to a large number of subscribers, as a result rather than implementing one large amplifier the design utilizes multiple smaller amplifiers, output signals from which are then combined.

The signal at the RF input port 300 is initially provided to Balun 305, which provides for a double-sided output configuration coupled to a first pair of amplifiers 302 and 304 for providing a first amplification to the RF signal. Considering firstly the upper RF amplifier 302 has its output ports electrically coupled to a second Balun 315 that provides for double-sided output ports, which are electrically coupled to a second pair of amplifiers 312 and 314 for providing further amplification of the RF signal. The output ports of the two amplifiers 312 and 314 are then combined to a common channel through a further Balun 335, which is electrically coupled to an input port of the final Balun stage 355.

Similarly the lower RF amplifier 304 has its output ports electrically coupled to a second Balun 325 which again provides for double-sided output ports, which are electrically coupled to a third pair of amplifiers 316 and 318 for providing further amplification of the RF signal. The outputs ports of the two amplifiers 316 and 318 are then combined to a common channel through a further Balun 345, which is electrically coupled to the second input port of the final Balun stage 355. The final Balun 355 therefore combines these input signals and as such the final RF output signal is coupled to the RF output port 310 and then aggregated into an amplified RF signal from 6 amplifier devices, these being 302, 304, 312, 314, 316 and 318.

As outlined, the Balun circuits provide for single sided to double side conversion, as did the Balun 220 outlined in FIG. 2. For clarity the impedance matching circuits of the embodiment have been omitted, due to their quantity, but elements such as described in FIG. 1 and FIG. 2 would be disposed into each RF amplifier electrical path on both the input and output portions thereof.

Figure 4A:
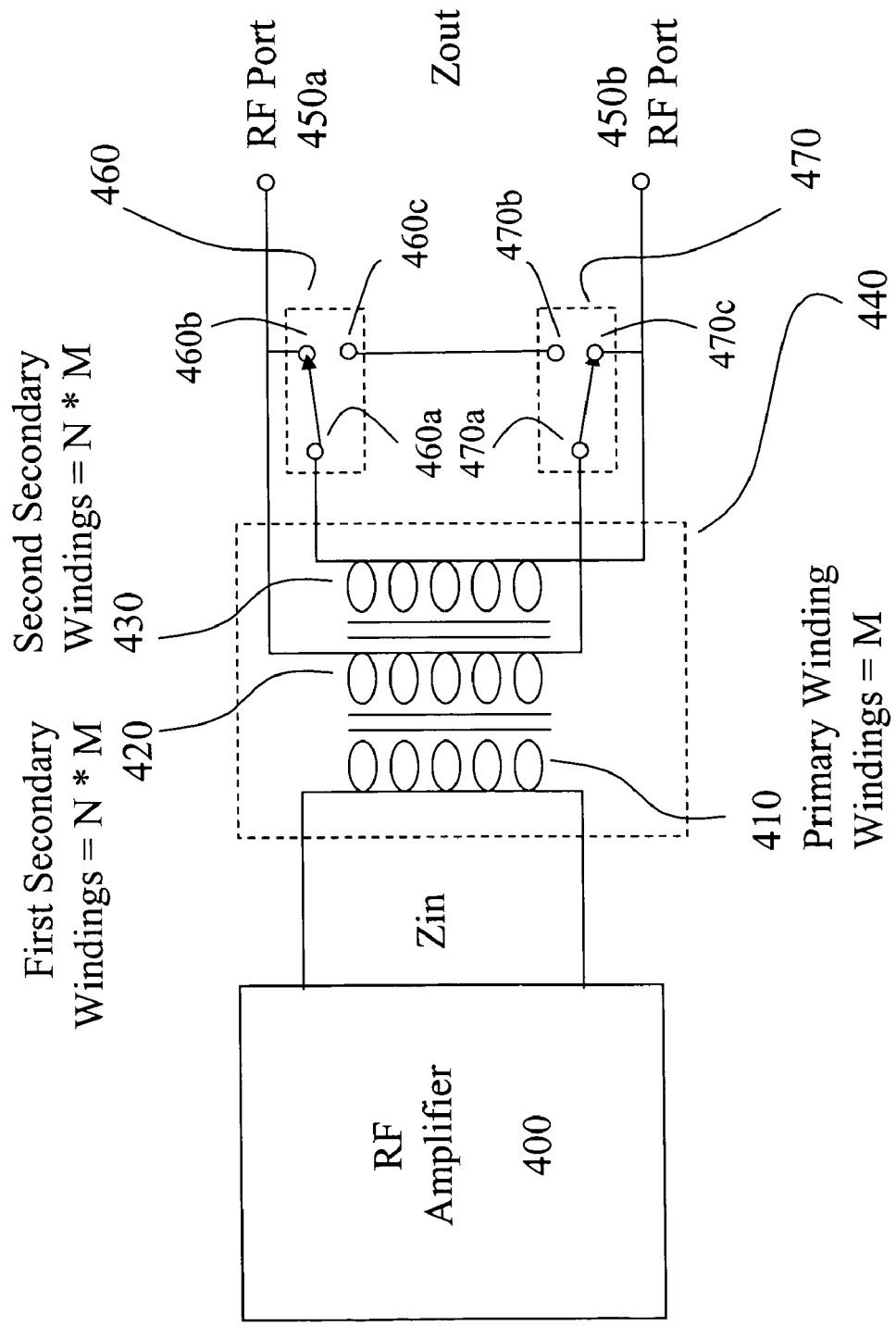
FIG. 4A illustrates a first embodiment of the invention wherein the microwave impedance transformer is configured to a first state providing a N:1 impedance transform.

FIG. 4A illustrates a first embodiment of the invention wherein the microwave impedance transformer is configured to a first state providing a 4:1 impedance transform. In this embodiment, a transformer 440 is disposed between an RF amplifier 400 and its RF output ports 450a and 450b.

As shown, the transformer 440 comprises three windings, a primary winding 410 comprising M turns, a first secondary winding 420 comprising N*M turns, and a second secondary winding 430 also comprising N*M turns. The primary winding 410 is connected across the output ports of the RF amplifier 400.

The first secondary winding 420 has one port electrically coupled to both the RF output port 450a and switch contact 460b of a first switching circuit 460. The other port of the first secondary winding 420 is electrically coupled to pole switch contact 470a of a second switching circuit 470.

The second secondary winding 430 has one port electrically coupled to both the RF output port 450b and switch contact 470c of a second switching circuit 470. The other port of the second secondary winding 430 is electrically coupled to pole switch contact 460a of a second switching circuit 460. The remaining switch contact 460c of first switching circuit 460 and 470b of second switching circuit 470 are electrically coupled.

In the configuration shown in FIG. 4A, first switching circuit is switched to connect the pole switch contact 460a with switch contact 460b, and the second switching circuit is switched to connect the pole switch contact 470a with switch contact 470c. In this manner the first secondary winding 420 and second secondary winding 430 are disposed in parallel. In operation the transformer acts to transform the voltage applied at the primary winding 410 to an output voltage across the first and second secondary windings based upon the winding ratio of these. As outlined supra, the secondary windings 420 and 430 each have N times the turns of the primary winding. The result is that the RF signal applied to the transformer from the RF amplifier with a characteristic impedance Zin is converted to an RF signal at the outputs ports 450a and 450b with a characteristic impedance Zout, where Zout=Zin*(Ratio of Windings)$^{-2}$. Hence for N=2, Zout=4Zin.

Figure 4B:
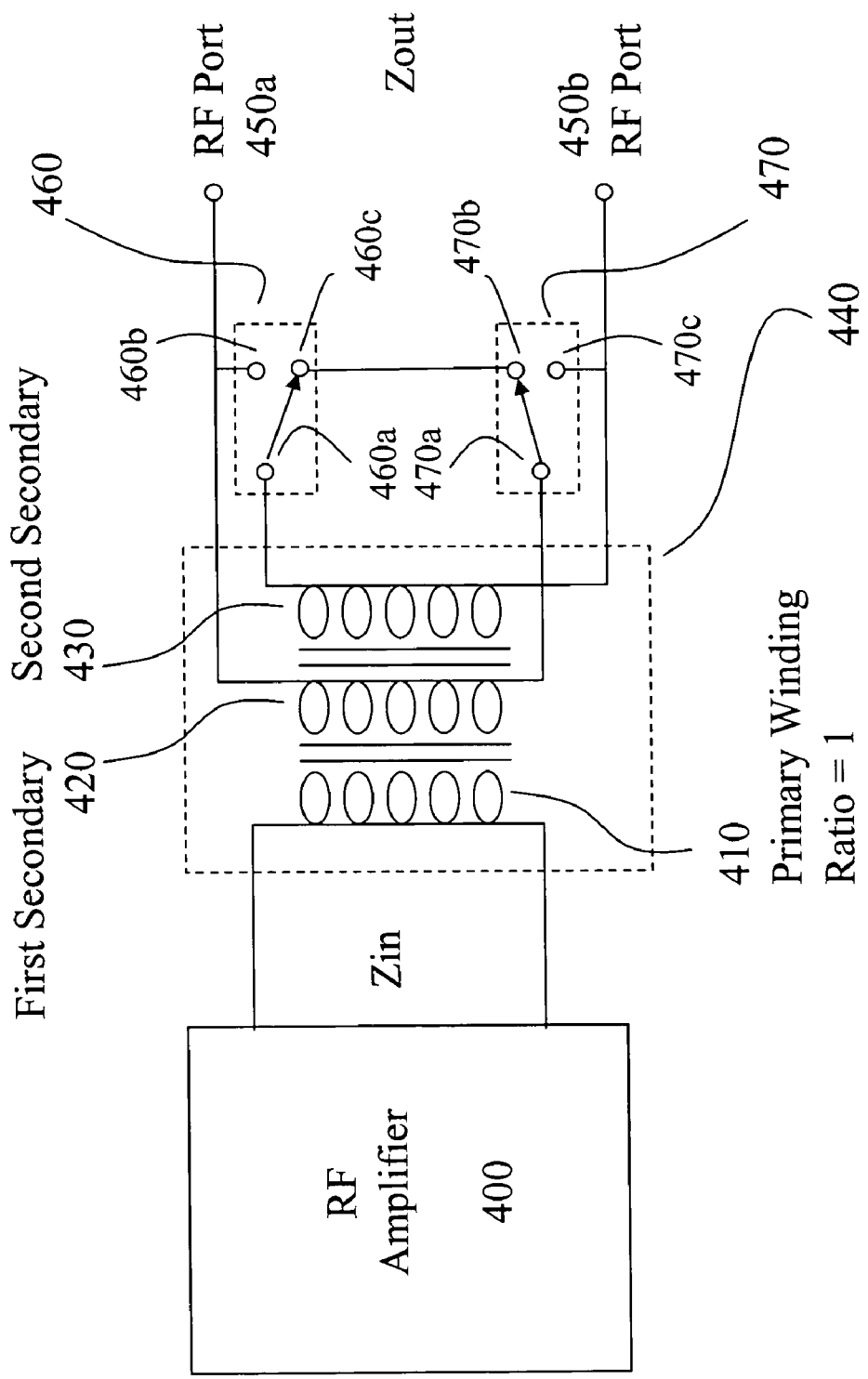
FIG. 4B illustrates a first embodiment of the invention wherein the microwave impedance transformer is configured to a second state providing a 16:1 impedance transform.

Referring to FIG. 4B the same RF amplifier 400, transformer 440 and electrical switches 460 and 470 are shown. Now, however, electrical switches 460 and 470 have been switched to a second switch state.

In the configuration shown in FIG. 4B, first switching circuit is switched to connect the pole switch contact 460a with switch contact 460c, and the second switching circuit is switched to connect the pole switch contact 470a with switch contact 470b. In this manner, the first secondary winding 420 and second secondary winding 430 are disposed in series. Now in operation the transformer acts to transform the voltage applied at the primary winding 410 to an output voltage across the first and second secondary windings based upon the winding ratio of these. As outlined above the secondary windings 420 and 430 each has N times the turns of the primary winding, and hence in this configuration the serial combination has 2N turns. The result is that the RF signal applied to the transformer from the RF amplifier with a characteristic impedance Zin is converted to an RF signal at the outputs ports 450a and 450b with a characteristic impedance Zout, where Zout=Zin*(Ratio of Windings)$^{-2}$. Hence for N=2, Zout=Zin* (2N)^2=Zin*(4)^2=16 Zin.

It would be evident to one skilled in the art that the embodiment as shown is modifiable such that the ratio of turns is another ratio other than the N=2, giving different ratios of impedance transformation. In another embodiment, the transformer 440 is coupled to the RF amplifier 400 and output ports 450a and 450b with an additional switch such that the windings were reversed. In this manner, the impedance of the RF amplifier Zin is stepped down in two different ratios, for the case N=2 by the same ¼ and ¹⁄₁₆ in the parallel and series configurations, respectively.

Figure 5:
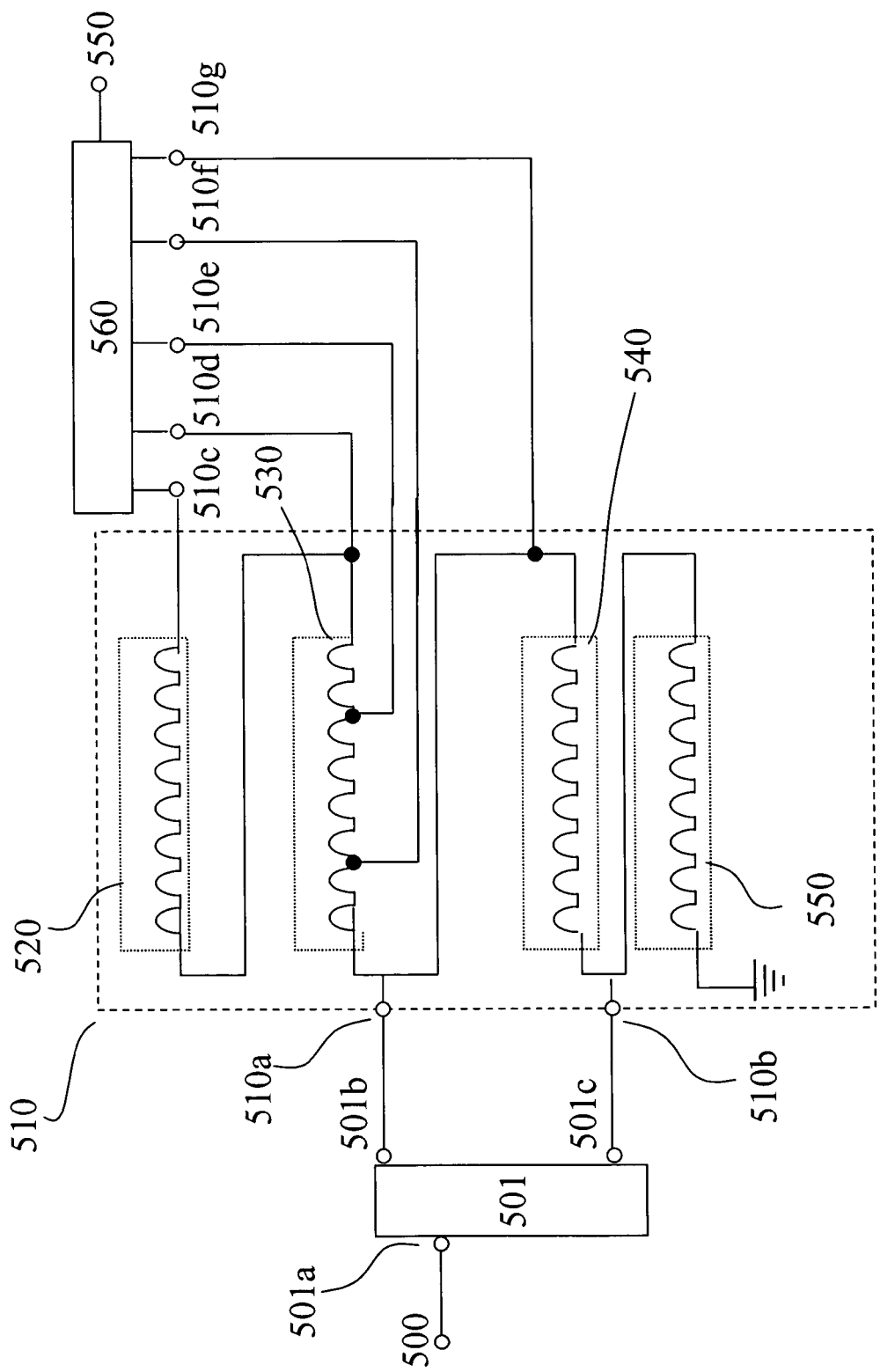
FIG. 5 illustrates a second embodiment of the invention wherein a microwave transformer provides tuning to one of eight different impedance transforms.

FIG. 5 illustrates a second embodiment of the invention wherein a microwave transformer provides one of eight impedance transforms. At high frequencies, such as encountered in RF and microwave circuits, the windings of the transformer are best considered as a series of transmission lines rather than lumped elements. As such a low frequency equivalent circuit for these devices is such that the transmission line winding is represented by an inductance, and when combining multiple windings phase effects should be considered. In this manner, a transformer operating at microwave and RF frequencies operates differently to its low frequency equivalent, for example for applications such as power transmission.

Shown in FIG. 5 is an RF input port 500, which is electrically coupled to the common contact 501a of the first switch circuit 501. The upper output port 501b of the first switch circuit 501 is electrically coupled to a first input port 510a of the transformer 510, and the lower output port 501c of the first switch circuit 501 is electrically coupled to the second input port 510b of the transformer 510.

In the embodiment shown, the transformer 510 comprises four windings, namely a first winding 520, a second winding 530, a third winding 540 and a fourth winding 550. These windings are wired serially with tap points. The first input port 510a is coupled between the second winding 530 and the third winding 540; whilst the second input port 510b is coupled between the third winding 540 and fourth winding 550.

The transformer has 5 output ports, the first output port being at the unconnected port of the first winding 520, the connected port being serially connected to the second winding 530. The second output port 510d is electrically coupled to the mid-point between the first winding 520 and second winding 530. The third output port 510e is electrically coupled to a tap placed along the length of the second winding 530, in the case shown at a quarter of the winding count.

The fourth output port 510f is likewise a tap along the length of the second winding 530 at the three-quarters point of the winding count. The final fifth output port 510g is electrically coupled to the mid-point between the third winding 530 and the fourth winding 540. The final, as yet unconnected port of the fourth winding 540 is actually electrically coupled to ground. The five output ports 510c through 510g of the transformer 540 are all electrically coupled to second switch circuit 560, which couples the selected output port 510c through 510g to the RF output port 550.

According to the specific combination of the first switching circuit 501 and the second switching circuit 560 the transformer provides for eight different impedance transforms. For equivalent windings, the highest ratio is when input port 510b is coupled to 510c, being a 1:9 impedance transform, and the lowest ratio is 1:1.36 when input port 510a is coupled to output port 510f.

The operation of a passive transformer is based upon mutual inductance between two or more conductors, or windings. The transformer is designed to couple alternating current from one winding to another. An electrically short section of transmission line, which is shorted at one end, has an input impedance given by $Z_{in} \approx R + j\omega L$, where R is the series resistance and L is the series inductance. A microstrip line is a known element of a monolithic semiconductor integrated circuit as such can be used to form a transmission line inductor, and therein form part of a transformer.

Figure 6:
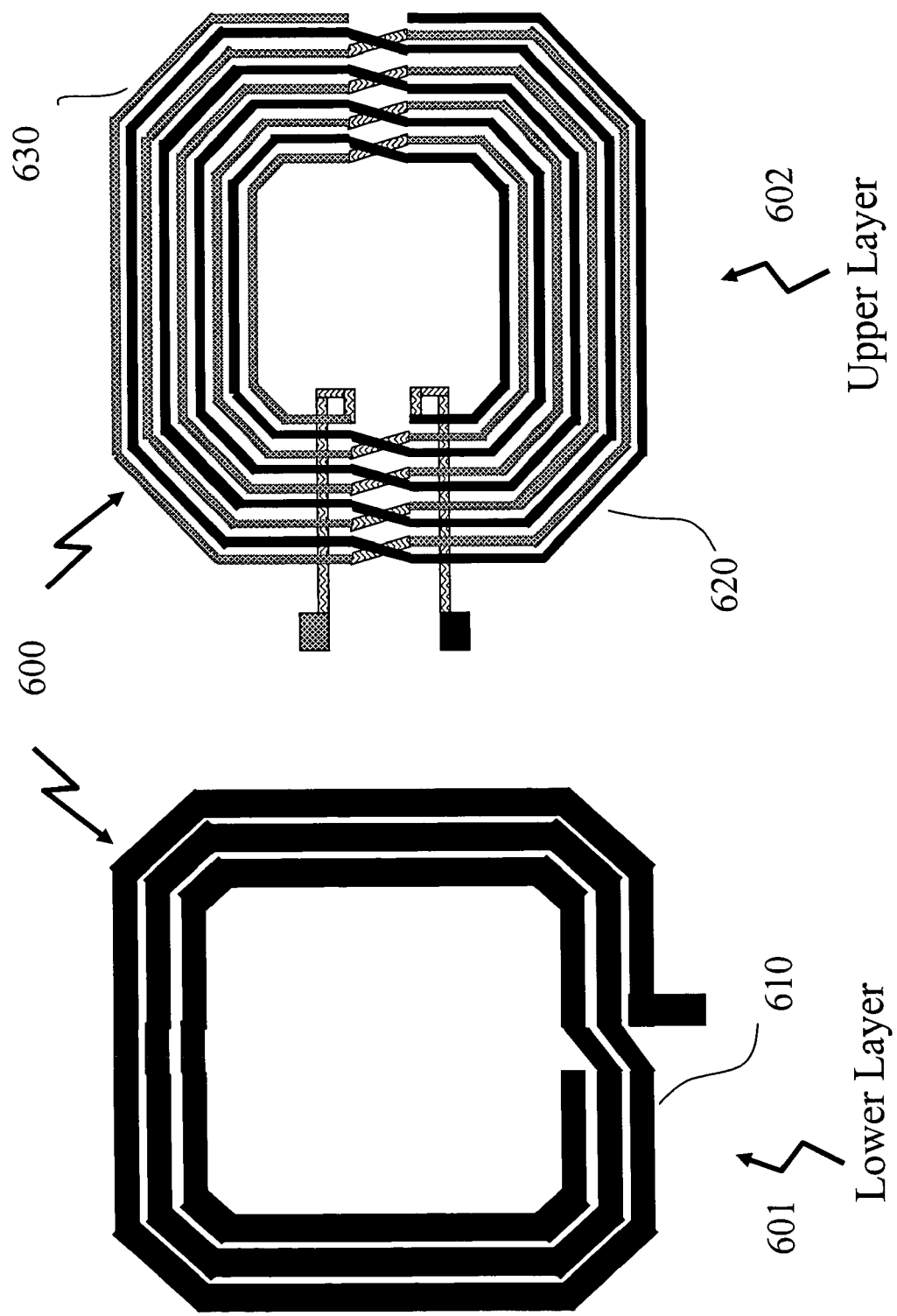
FIG. 6 illustrates an embodiment of a three winding transformer using spiral conductors with dielectric spacing for on-chip integration with a semiconductor circuit.

FIG. 6 illustrates an embodiment of a three winding transformer 600 using microstrip lines and showing one possible embodiment for integration within a semiconductor circuit. The winding transformer 600 shown is a multi-level design with two layers, 601 and 602, with an intermediate dielectric layer, which is omitted for clarity. The lower layer 601 provides a primary winding of the transformer 600 and is shown as a spiral inductor. The upper layer 602 comprises two spiral transmission lines 620 and 630, interleaved and disposed vertically and centrally to the lower level track 610. Additionally, the interleaved spiral transmission lines 620 and 630 exploit semiconductor via designs for interconnecting the spiral sections.

Figure 7:
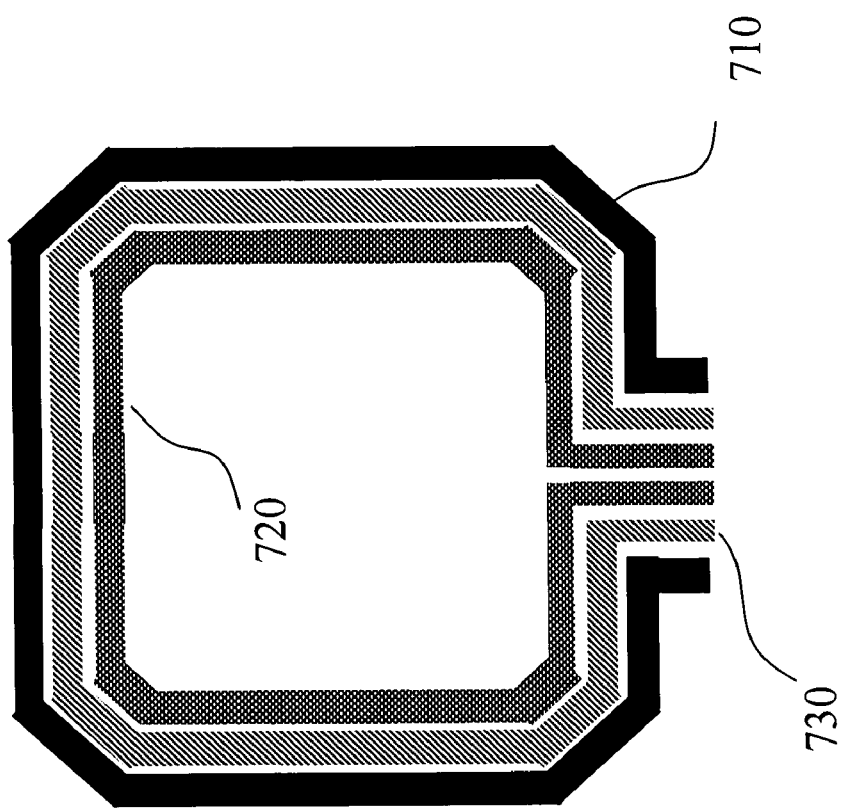
FIG. 7 illustrates an embodiment of a three winding transformer using spiral conductors formed on a common surface for on-chip integration with a semiconductor circuit.

The transformer 600 is not suited to all semiconductor RF circuits as the multi-layer design adds additional complexity and cost. An alternative is shown in FIG. 7, wherein a single layer integrated transformer is shown, again comprising three windings. Shown is the primary winding 730, the first secondary winding 710 and the second secondary winding 720. In the design shown the transmission line inductive coupling is limited to the common periphery of the transformer windings. This design approach expandable through use of air-bridges and other known techniques for semiconductor substrates such as GaAs and InP where multi-layer electrical interconnections, for example those outlined in FIG. 6, are less common or developed.

It would be evident to one skilled in the art that many other layouts are employable using transmission lines with different geometries and positions to create multi-winding transformers. The designs outlined in FIG. 6 and FIG. 7 are two of many embodiments facilitating the monolithic integration of the switchable transformer approach to impedance matching with active semiconductor circuits, such as RF amplifiers. Numerous other embodiments may be envisaged without departing from the spirit or scope of the invention.

What is claimed is:

1. A circuit comprising:
   a substrate;
   an input port integrated within the substrate for receiving an input RF signal;
   an output port integrated within the substrate supporting each of a predetermined set of available impedance characteristics for providing an output RF signal based on the input RF signal;
   a first electrical track integrated within the substrate for transmission of the input RF signal;
   a second electrical track integrated within the substrate for being inductively coupled to the first electrical track;
   a third electrical track integrated within the substrate for being inductively coupled to the first electrical track;
   at least a switch integrated within the substrate, the at least a switch operable between a first state and a second state, the at least a switch for in the first state resulting in the second electrical track and third electrical track electrically coupled in a first configuration and wherein, in the first state, the first electrical track and the second and third electrical tracks are electrically coupled between the input port and the output port for providing a first impedance characteristic from the predetermined set of available impedance characteristics at the output port; and
   for in the second state resulting in a the second and third electrical track electrically coupled in a second configuration, and wherein, in the second state, the first electrical track and the second and third electrical tracks are electrically coupled between the input port and the output port for providing a second other impedance characteristic from the predetermined set of available impedance characteristics at the output port.

2. A circuit according to claim 1 wherein;
   the first configuration is one of a series or parallel combination of the second and third electrical tracks.

3. A circuit according to claim 2 wherein;
   the second configuration is the other of series or parallel combination of the second and third electrical tracks.

4. A circuit according to claim 2 further comprising
   a switch control circuit electrically connected to the at least a switch, the switch control circuit having a switch setting port for receiving a switch setting signal and for providing a control signal for controlling the at least a switch in response to the switch setting signal.

5. A circuit according to claim 4 wherein;
   the switch setting signal is established in relation to at least one a measurement of the reflected power from the output port, a measurement of the transmitted power from the output port, and the target output power of the circuit.

6. A circuit according to claim 1 wherein;
   the first electrical track, the second electrical track, and the third electrical track are inter-wound spiral conductors disposed on a common surface of the substrate.

7. A circuit according to claim 1 wherein;
the first electrical track is disposed on a first surface of the substrate; and,
the second electrical track is disposed on a second surface of the substrate.

8. A circuit according to claim 7 wherein
the third electrical track is disposed on a third surface of the substrate.

9. A circuit according to claim 7 wherein;
the third electrical track is disposed on the second surface of the substrate.

10. A circuit according to claim 7 wherein;
the third electrical track is disposed on the first surface of the substrate.

11. A circuit according to claim 7 wherein;
the first surface is disposed between the second and third surfaces of the substrate.

12. A circuit according to claim 7 wherein;
the first to third electrical tracks are spirals.

13. A circuit according to claim 7 wherein;
any spacing between the surfaces has some dielectric material disposed therein.

14. A circuit according to claim 1 wherein
the second electrical track comprises an electrical tap, the electrical tap defining at least first and second portions of the second electrical track for electrical connection by the at least a switch in conjunction with the first and third electrical tracks to provide a plurality of electrical configurations, each electrical configuration providing an impedance characteristic from the predetermined set of available impedance characteristics at the output port.

15. A circuit according to claim 1 further comprising:
a microwave circuit electrically connected to at least one of the input or output ports of the circuit for operating on the RF signal.

16. A circuit according to claim 1 wherein:
the circuit is manufactured using a semiconductor technology.

17. A circuit according to claim 1 wherein:
the semiconductor technology relates to at least one of Si, SiGe, GaAs and InP.

18. A method of providing a switchable impedance transformer for an RF circuit by:
providing a substrate;
providing an input port integrated within the substrate for receiving an input RF signal;
providing an output port integrated within the substrate supporting each of a predetermined set of available impedance characteristics for providing an output RF signal based on the input RF signal;
providing a first electrical track integrated within the substrate for transmission of the input RF signal;
providing a second electrical track integrated within the substrate for being inductively coupled to the first electrical track;
providing a third electrical track integrated within the substrate for being inductively coupled to the first electrical track;
providing at least a switch integrated within the substrate, the at least a switch operable between a first state and a second state; wherein
the at least a switch in the first state resulting in a first configuration of the second and third electrical tracks and providing a first impedance characteristic from the predetermined set of available impedance characteristics at the output port; and the at least a switch in the second state resulting in a second configuration of the second and third electrical tracks and providing a second other impedance characteristic from the predetermined set of available impedance characteristics at the output port.

19. A method according to claim 18 wherein;
providing the first configuration of the at least a switch is by one of a series or parallel combination of the second and third electrical tracks.

20. A method according to claim 19 wherein;
providing the second configuration of the at least a switch is other of series or parallel combination of the second and third electrical tracks.

21. A method according to claim 18 wherein;
providing the first electrical track, the second electrical track, and the third electrical track is achieved by implementing inter-wound spiral conductors disposed on a common surface of the substrate.

22. A method according to claim 18 wherein;
providing the first electrical track is by disposing the first electrical track on a first surface of the substrate; and
providing the second electrical track is by disposing the second electrical track on a second surface of the substrate.

23. A method according to claim 22 wherein
providing the third electrical track is by disposing the third electrical track on a third surface of the substrate.

24. A method according to claim 22 wherein;
providing the third electrical track is by disposing the third electrical track on the second surface of the substrate.

25. A method according to claim 22 wherein;
providing the third electrical track is by disposing the third electrical track on the first surface of the substrate.

26. A method according to claim 22 wherein;
providing the first surface is achieved by disposing the first surface between the second and third surfaces of the substrate.

27. A method according to claim 22 wherein;
providing the first electrical track, second electrical track, and third electrical track is by providing spiral conductors.

28. A method according to claim 22 wherein;
the step of providing any of the first surface, second surface and third surface with any spacing between the surfaces is achieved by providing a dielectric material disposed therein.

29. A method according to claim 18;
wherein the step of providing the second electrical tracks includes providing at least an electrical tap, the electrical tap for defining at least first and second portions of the second electrical track; and
further providing for electrical connection by the at least a switch in conjunction with the first electrical track and third electrical track to provide a plurality of configurations, each configuration providing a impedance characteristic from the predetermined set of available impedance characteristics at the output port.

30. A method according to claim 18 further comprising;
providing a microwave circuit electrically connected to at least one of the input or output ports of the circuit for operating upon the RF signal.

31. A method according to claim 18 wherein;
the steps of providing the input port, the output port, the first electrical track, the second electrical track, the third electrical track and the at least a switch is achieved by using a semiconductor manufacturing technology.

32. A circuit according to claim 31 wherein;
the semiconductor manufacturing technology relates to at least one of Si, SiGe, GaAs and InP.

33. A method according to claim 18 further comprising
providing a switch control circuit electrically connected to the at least a switch, the switch control circuit having a switch setting port for receiving a switch setting signal and providing a control signal for controlling the at least a switch in relation to the switch setting signal.

34. A method according to claim 33 wherein;
the step of providing the switch setting signal is by providing a signal in relation to at least one of a measurement of reflected power from the output port, a measurement of the transmitted power from the output port, and the target output power of the circuit.

35. A memory storage having instruction data stored therein for when executed resulting in a circuit comprising:
a substrate;
an input port integrated within the substrate for receiving an input RF signal;
an output port integrated within the substrate supporting each of a predetermined set of available impedance characteristics for providing an output RF signal based on the input RF signal;
a first electrical track integrated within the substrate for transmission of the input RF signal;
a second electrical track integrated within the substrate for being inductively coupled to the first electrical track;
a third electrical track integrated within the substrate for being inductively coupled to the first electrical track;
at least a switch integrated within the substrate, the at least a switch operable between a first state and a second state, the at least a switch for in the first state resulting in the second electrical track and third electrical track electrically coupled in a first configuration and wherein, in the first state, the first electrical track and the second and third electrical tracks are electrically coupled between the input port and the output port for providing a first impedance characteristic from the predetermined set of available impedance characteristics at the output port; and
for in the second state resulting in a the second and third electrical track electrically coupled in a second configuration, and wherein, in the second state, the first electrical track and the second and third electrical tracks are electrically coupled between the input port and the output port for providing a second other impedance characteristic from the predetermined set of available impedance characteristics at the output port.

* * * * *